United States Patent
Mondal et al.

(10) Patent No.: US 6,982,605 B2
(45) Date of Patent: Jan. 3, 2006

(54) TRANSFORMER COUPLED OSCILLATOR AND METHOD

(75) Inventors: Jyoti Mondal, Palatine, IL (US); Neil Calanca, Crown Point, IN (US); Yan Cui, Gurnee, IL (US); Joseph Golat, Evanston, IL (US)

(73) Assignee: Freescale Semiconductor, Inc., Austin, TX (US)

( * ) Notice: Subject to any disclaimer, the term of this patent is extended or adjusted under 35 U.S.C. 154(b) by 96 days.

(21) Appl. No.: 10/427,581

(22) Filed: May 1, 2003

(65) Prior Publication Data

US 2004/0222861 A1  Nov. 11, 2004

(51) Int. Cl.
*H03B 5/00* (2006.01)

(52) U.S. Cl. .............................. 331/117 R; 331/117 FE; 331/175; 331/167; 331/36 L

(58) Field of Classification Search ............. 331/117 R, 331/117 FE, 167, 175, 36 L, 177 V
See application file for complete search history.

(56) References Cited

U.S. PATENT DOCUMENTS

| | | | |
|---|---|---|---|
| 4,999,589 A | 3/1991 | DaSilva | |
| 5,422,605 A | * 6/1995 | Yang et al. | 331/116 R |
| 5,821,802 A | 10/1998 | Yuen | |
| 6,026,286 A | * 2/2000 | Long | 455/327 |
| 6,150,893 A | 11/2000 | Fattaruso | |
| 2001/0007437 A1 | 12/2002 | Mashimo | |
| 2001/0013813 A1 | 3/2003 | Forbes | |

OTHER PUBLICATIONS

Plouchart et al., "A Fully–Monolithic SiGe Differential Voltage–Controlled Oscillator for 5 GHZ Wireless Applications," 2000 IEEE Radio Frequency Integrated Circuits Symposium, pp. 57–60, Yorktown Heights, New York.

Tchamov et al., "High–Performance Differential VCO Based on Armstrong Oscillator Topology," IEEE Journal of Solid–State Circuits, vol. 36, No. 1, January 2001, pp. 139–141.

* cited by examiner

*Primary Examiner*—Arnold Kinkead
(74) *Attorney, Agent, or Firm*—Toler, Larson & Abel, LLP

(57) ABSTRACT

In a particular embodiment, an oscillator adjustment circuit is disclosed. The oscillator adjustment circuit includes a resonator portion comprising a capacitive element coupled to an inductive element and a signal balancing portion comprising a secondary coil of the transformer. The inductive element comprises a primary coil of a transformer. The secondary coil has a grounded center tap.

20 Claims, 2 Drawing Sheets

TRANSFORMER COUPLED OSCILLATOR AND METHOD

BACKGROUND

1. Field of the Disclosure

The present disclosure relates generally to oscillator adjustment circuits and related methods.

2. Description of the Related Art

In communication device receivers, oscillation circuits, such as a conventional voltage controlled oscillator (VCO), are commonly used. Certain oscillation circuits provide a differential output that may be corrected using a dedicated active circuit, such as a feedback amplifier. The requirement to add such active circuitry is a disadvantage due to consumption of current and space. Reduced space and current consumption is at a premium for mobile devices, such as cell phones and similar handsets.

Accordingly, an improved oscillator circuit and method is desirable and would be useful.

BRIEF DESCRIPTION OF THE DRAWINGS

The use of the same reference symbols in different drawings indicates similar or identical items.

DESCRIPTION OF THE PREFERRED EMBODIMENT(S)

In a particular embodiment, an oscillator adjustment circuit is disclosed. The oscillator adjustment circuit includes a primary coil of a transformer forming at least a portion of an oscillator element. The oscillator adjustment circuit further includes a secondary coil of the transformer. The secondary coil has an offset grounded center tap.

Figure 1:
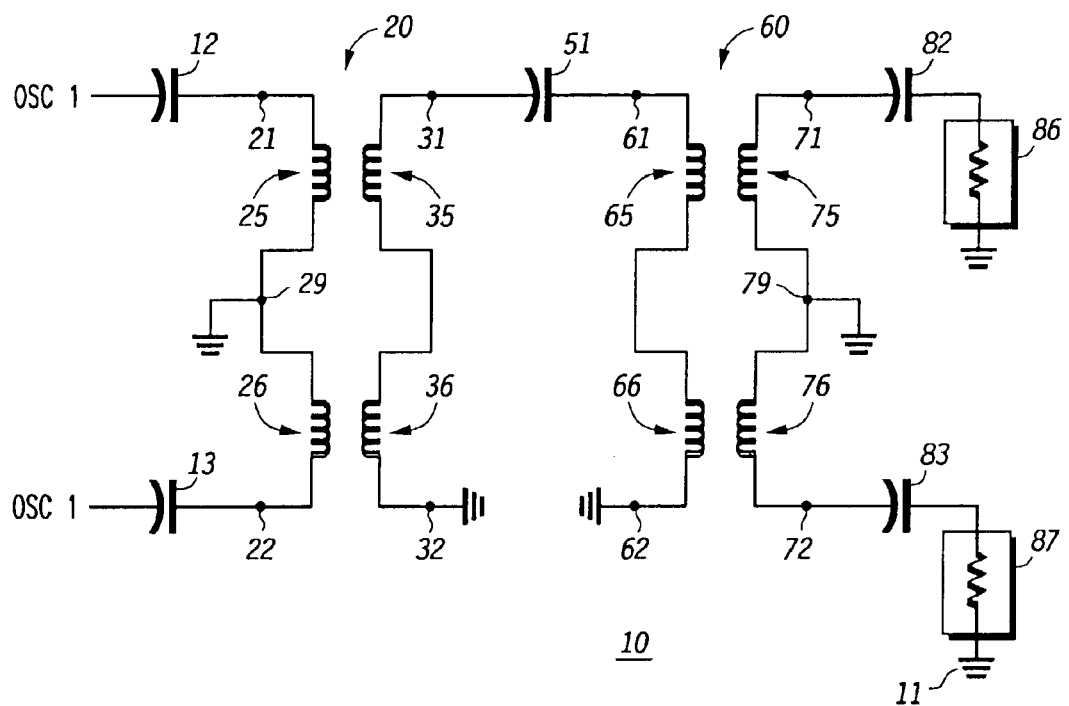
FIG. 1 is a circuit diagram that illustrates an embodiment of an oscillator including an oscillation adjustment circuit.

Referring to FIG. 1, an oscillator adjustment circuit 10 is illustrated. The oscillator adjustment circuit 10 has a first transformer 20 and a second transformer 60. The first transformer 20 has a primary coil that includes a first portion 25, a second portion 26, and a primary coil center tap 29 that is grounded. The first transformer 20 also includes a secondary coil which has a first portion 35, a second portion 36, and a center tap. The first transformer 20 has primary transformer terminals 21 and 22 and secondary transformer terminals 31 and 32. The first transformer 20 is responsive to an oscillator signal that is fed to a first capacitor 12. Similarly, the first transformer 20 is responsive to a second oscillator signal that is fed through capacitor 13. The first transformer is coupled to the second transformer 60 via a direct current (DC) blocking capacitor 51.

The second transformer 60 includes a primary coil having a first portion 65 and a second portion 66. The second transformer 60 includes a secondary coil having a first portion 75, a second portion 76, and a grounded center tap 79. The second transformer 60 has primary transformer terminals 61 and 62 and secondary transformer terminals 71 and 72. The secondary transformer terminals 71 and 72 are coupled via intermediate capacitors 82 and 83, to final output loads 86 and 87, which may be buffer amplifiers.

During operation, the first oscillator signal as received at the primary transformer terminal 21 via capacitor 12 is fed to the first portion of the primary coil 25. Similarly, the second oscillator signal received at primary transformer terminal 22 via capacitor 13 is fed to the second portion 26 of the primary coil of the first transformer 20. The first oscillator signal is out of phase with respect to the second oscillator signal. A combined signal from adding the first and second oscillator signals in a vector fashion is received at the secondary coil of the first transformer 20 due to inductive coupling.

The resulting combined signal is provided at the secondary transformer terminal 31 and fed to the DC blocking capacitor 51. At the first primary terminal 61 of the second transformer 60, the combined oscillator signal from the first transformer 20 is received. The combined oscillator signal is then fed to the primary coil of the second transformer 60. Again, using the inductive properties of the second transformer 60, a balanced impedance matched oscillation signal is derived at the secondary coil of the second transformer 60. With the grounded center tap 79 of the secondary coil, an equal portion of the output oscillator signal is forwarded to each of the primary transformer terminals 71 and 72, respectively. Thus, a substantially equal portion of the combined oscillation signal is fed to the first load 86 via the capacitor 82 and to the second load 87 via capacitor 83. Each of the transformers 20 and 60 are low loss transformers and consumes very little dc power (less than 4 milliwatts and typically in the range of 0.002–0.003 Watts). A particular application of the oscillator adjustment circuit 10 is as part of a voltage control oscillator component that may be found within a receiver design of a hand-held communication unit, such as a cellular phone or similar device. In this case, the OSC 1 and 2 inputs to circuit 10 are differential outputs from a differential oscillator. In such applications, low power and low current consumption is particularly beneficial.

Figure 2:
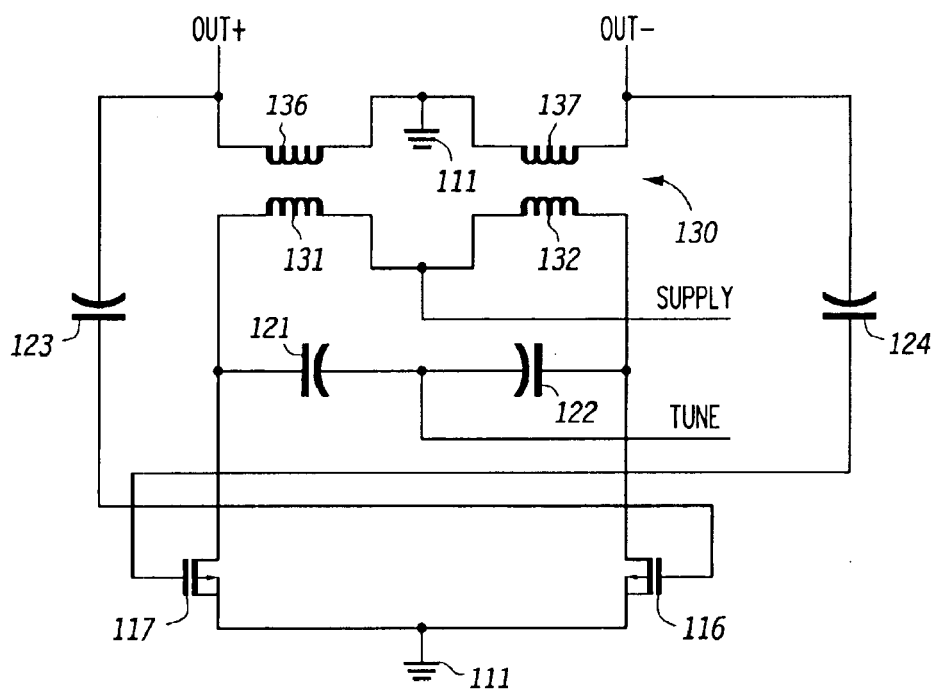
FIG. 2 is a circuit diagram that illustrates an embodiment of an oscillator including an oscillation adjustment circuit.

Referring to FIG. 2, another embodiment of an oscillator circuit is illustrated. The oscillator circuit includes a set of differential pair transistors 116, 117, impedance resonating elements including capacitors 121 and 122, and primary coil inductor elements 131 and 132. The inductor elements of the oscillation circuit forms a primary coil of a transformer 130. The oscillator circuit shown in FIG. 2 also includes a signal balancing portion of the transformer 130. The signal balancing portion of the transformer 130 is implemented as a secondary coil that has a first portion 136, a second portion 137, and a grounded center tap. In a particular embodiment, the grounded center tap 111 is offset from direct center of the secondary coil of the transformer 130 to provide for adjustments to phase and amplitude in balance of the respective oscillator signals generated by the oscillator circuit including the differential transistors 116 and 117. The particular position of the offset center tap may be determined through empirical testing and simulations. The amplitude and phase balance is accomplished by a small adjustment of the location of the center ground tap of the output transformer. The adjustment is made by using appropriate circuit simulation, creating a few initial versions of the design, taking measurement on the initial versions, and selecting the version based on the measurements. In a particular embodiment, the location of the center tap is fixed for a given circuit design. Alternatively, the center tap location could be varied on an individual part basis. The transformer 130 has a first output and a second output. The first output is a positive output terminal that is coupled to capacitor 123 and the second output is a negative output terminal coupled to capacitor 124.

During operation of the oscillator circuit, a desired frequency of operation is reached by tuning input to a node within the first and second capacitors 121 and 122. A supply voltage to power the transistors 116 and 117 is fed to the center tap of the primary coil. With the primary coil of transformer 130 supplied and with a desired frequency selected, the oscillator circuit resonates at the desired frequency and a combined oscillator signal is then inductively received at the secondary coil of the transformer 130. The combined balanced and matched signal is provided by the secondary coil of the transformer 130 as an output at the positive and negative terminal as illustrated in FIG. 2.

Figure 3:
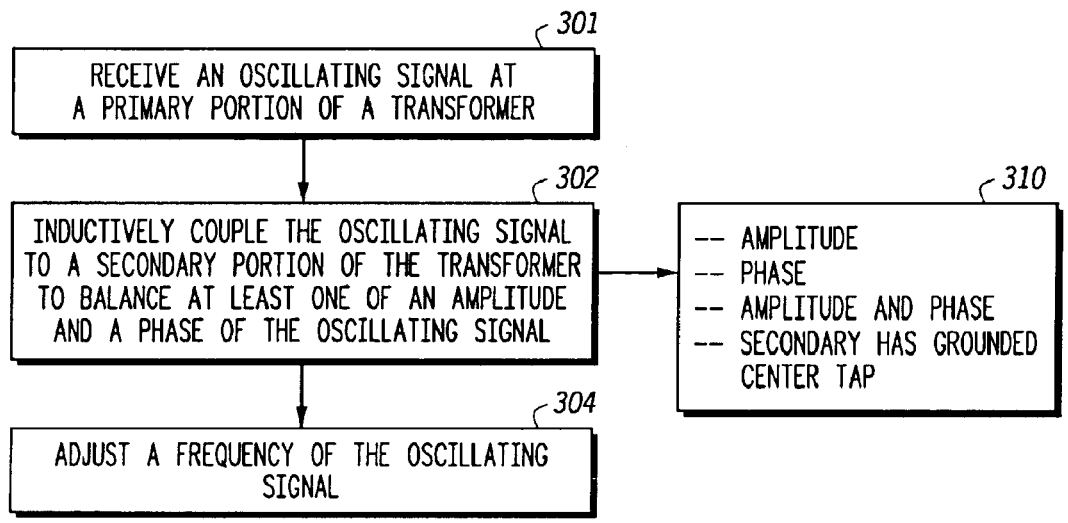
FIG. 3 is a flow chart that illustrates operation of the oscillator of FIG. 2

Illustration of the operation and method of using the oscillator circuit described in FIG. 2 is illustrated with respect to FIG. 3. As shown in step 301, an oscillator signal is received at a primary portion of a transformer. The oscillation signal is then inductively coupled to a second portion of the transformer to balance at least one of amplitude and a phase of the oscillation signal, as shown at 302. A frequency of the oscillation signal may be adjusted as shown at 304. In a particular embodiment, both the amplitude and phase of the derived oscillation signal carried by the secondary portion of the transformer are balanced. The balancing function is implemented by the selected position of the offset grounded center tap of the secondary portion of the transformer.

The illustrated transformer circuit may be implemented in a semi-conductor device in various ways. In a particular embodiment, the transformer may use deep trench technology to reduce its impact on oscillator noise within the elements of the overall circuit design.

In a particular embodiment, a deep trench with a width of approximately 1 micrometer and a depth of approximately 6 micrometers may be etched into a silicon substrate before any device is fabricated. The trenches are laid out parallel side by side with a spacing of approximately 1.5 micrometers. The trenches are then filled with low loss and low dielectric constant field oxide. A set of such trenches, may be placed orthogonal to the direction of current that flows through a conducting metal line laid over the trenches so that induced eddy current flow is reduced in the underlying lossy silicon substrate and thereby reducing the substrate loss. The low dielectric constant of the trench filler material helps reduce the parasitic coupling to the lossy silicon substrate, thus reducing the substrate loss further. The combined effect on the transformer in this case is to raise the quality factor of the transformer and to lower the oscillator noise.

The disclosed embodiments of a transformer coupled oscillator may be beneficially used in connection with a voltage controlled oscillator (VCO) circuit. A voltage controlled oscillator circuit that includes the disclosed transformer coupled oscillator may be used to replace a separate active transistor-based circuit for performing duty cycle adjustment. One advantage of the disclosed transformer coupled oscillator circuit that may occur over the conventional active duty cycle circuit is a reduction of current drain and space within the design of the voltage-controlled oscillator component. In addition, the illustrated transformer design may have an improved time response compared with an active feedback circuit that has a finite time delay. Further, the non-linearity effects associated with active circuit elements are removed.

Figure 4:
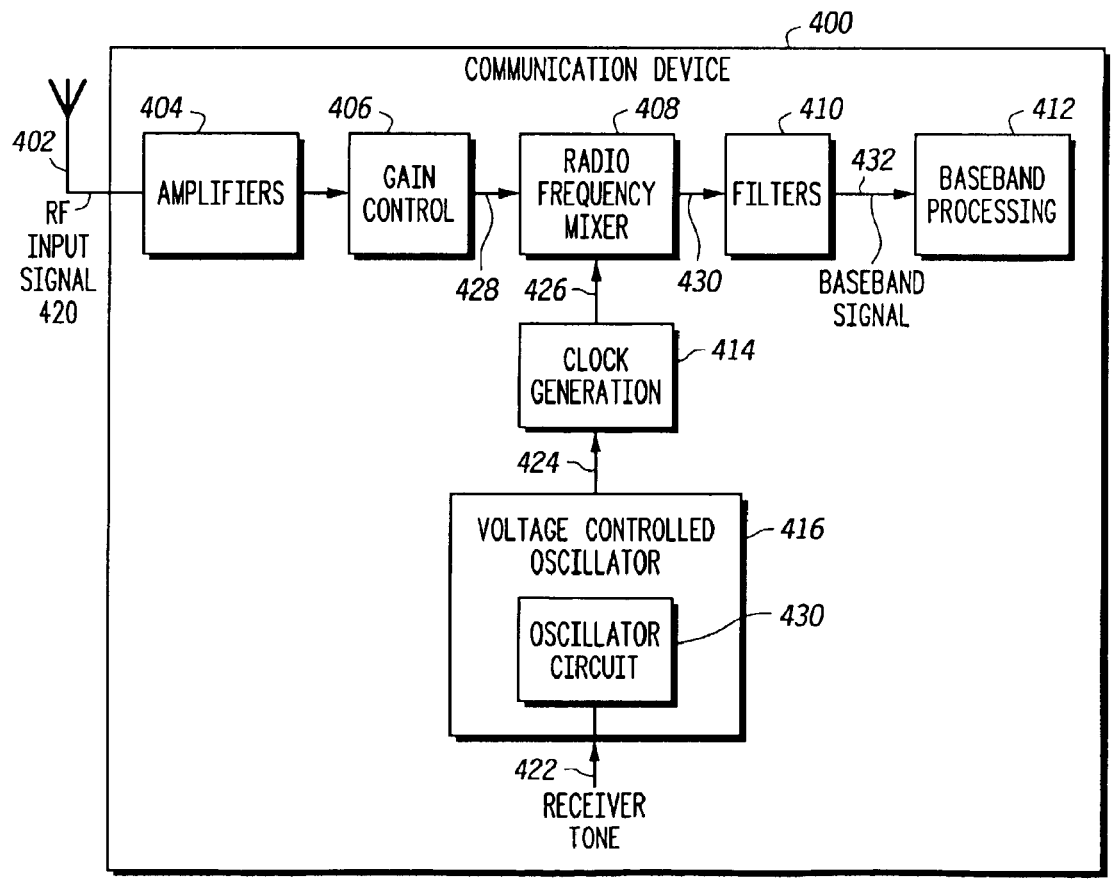
FIG. 4 is a block diagram of a communication device including an oscillator.

Referring to FIG. 4, an embodiment of a communication device 400 that incorporates an oscillator circuit is shown. The communication device 400 in one embodiment is a wireless communication device such as a cellular telephone, a personal digital assistant (PDA), or a similar device. The communication device 400 includes an antenna 402, amplifiers 404, an automatic gain control stage 406, a radio frequency (RF) mixer 408, filters 410, and a baseband processing module 412. The communication device 400 also includes clock generation unit 414 and a voltage controlled oscillator 416 that includes an oscillator circuit 430. In a particular embodiment, the oscillator circuit 430 may be any of the disclosed oscillator circuits described above with reference to FIGS. 1–3. The voltage controlled oscillator 416 receives a tuning input 422 to select a desired frequency and produces a voltage controlled oscillator output 424 that is fed to the clock generation unit 414.

During operation, a radio frequency signal 420 is received at the antenna 402, and is amplified by at least one of the amplifiers 404. The output of the amplifiers 406 is fed to the gain control unit 406 and the resulting amplified and gain controlled signal 428 is fed to the RF mixer stage 408. The RF mixer 408 mixes the amplified and gain controlled signal 428 with the signal 426 from the clock generation unit 414 to produce the mixed output signal 430. The mixed output signal 430 is then filtered by various filters 410 to produce a resulting baseband signal 432. The baseband signal 432 is then processed by the baseband processing module 412.

The communication device disclosed may have many other configurations. The oscillator circuit also may have configurations other than the specific examples disclosed. The oscillator may be used in a variety of other types of devices, including different types of communication devices.

The above disclosed subject matter is to be considered illustrative and the appended claims are intended to cover all such modifications and other embodiments which fall within the true spirit and scope of the present invention. Thus, to the maximum extent allowed by law, the scope of the present invention is to be determined by the broadest possible interpretation of the following claims and their equivalents, and shall not be restricted or limited by the foregoing detailed description.

What is claimed is:

1. An oscillator comprising:
   a resonator portion comprising a capacitive element coupled to an inductive element, wherein the inductive element comprises a primary coil of a transformer; and
   a signal balancing portion comprising a secondary coil of the transformer, the secondary coil having a grounded center tap offset from a center location of the secondary coil.

2. A method comprising:
   receiving an oscillating signal at a primary coil of a transformer;
   inductively coupling the oscillating signal to a secondary coil of the transformer to balance at least one of an amplitude and a phase of the oscillating signal;
   wherein the secondary coil comprises a first portion, a second portion, and grounded center tap between the first portion and the second portion, the center tap offset from a center location of the secondary coil.

3. The method of claim 2, wherein both the amplitude and the phase are balanced.

4. The method of claim 2, further comprising adjusting a frequency of the oscillating signal.

5. An oscillator adjustment circuit comprising:
   a primary coil of a transformer forming at least a portion of an oscillator element; and
   a secondary coil of the transformer comprising a grounded center tap that is offset from a center location of the secondary coil.

6. The circuit of claim 5, wherein the secondary coil of the transformer provides a first output and a second output.

7. The circuit of claim 5, wherein the primary coil of the transformer is coupled to a differential circuit including a first transistor and a second transistor.

8. The circuit of claim 5, wherein the primary coil of the transformer is coupled to at least one capacitor element, the at least one capacitor element responsive to a frequency tuning input.

9. The circuit of claim 5, wherein the primary coil of the transformer has a center tap, the center tap responsive to a voltage supply.

10. An oscillator adjustment circuit comprising:
a first coil of a second low loss transformer responsive to a first low loss transformer, the first transformer responsive to an oscillator; and
a second coil of the second low loss transformer inductively coupled to the first coil of the second low loss transformer.

11. The oscillator adjustment circuit of claim 10, wherein the first and second transformers have a dc power consumption less than four milliwatts.

12. The circuit of claim 10, wherein the second coil of the second transformer provides a first output and a second output.

13. The circuit of claim 10, wherein the first coil of the first transformer is coupled to at least one capacitive element.

14. The circuit of claim 10, wherein the first coil of the first transformer has a grounded center tap and wherein the first coil of the second transformer has a grounded center tap.

15. The circuit of claim 10, wherein a first output of the second transformer is provided to a first load and a second output of the second transformer is provided to a second load.

16. A communication device comprising:

an antenna;

a voltage controlled oscillator including an oscillator circuit, the oscillator circuit comprising a resonator portion including a capacitive element coupled to an inductive element, wherein the inductive element comprises a primary coil of a transformer and a signal balancing portion including a secondary coil of the transformer, the secondary coil having a grounded center tap offset from a center location of the secondary coil; and a radio frequency mixer responsive to the antenna and responsive to the voltage controlled oscillator.

17. The communication device of claim 16, further comprising a clock generation unit responsive to the voltage controlled oscillator and coupled to the radio frequency mixer.

18. The communication device of claim 16, comprising a baseband processing module, the baseband processing module responsive to the radio frequency mixer.

19. The communication device of claim 16, further comprising at least one amplifier responsive to the antenna.

20. A communication device comprising:

an antenna;

a voltage controlled oscillator including an oscillation circuit having an oscillator adjustment circuit comprising a primary coil of a transformer forming at least a portion of an oscillator element and a secondary coil of the transformer comprising a grounded center tap that is offset from a center location of the secondary coil; and a radio frequency mixer responsive to the antenna and responsive to the voltage controlled oscillator.

* * * * *

UNITED STATES PATENT AND TRADEMARK OFFICE
CERTIFICATE OF CORRECTION

PATENT NO. : 6,982,605 B2
DATED : January 3, 2006
INVENTOR(S) : Jyoti Mondal et al.

It is certified that error appears in the above-identified patent and that said Letters Patent is hereby corrected as shown below:

Column 15,
Line 15, insert -- low loss -- between "the first" and "transformer.".
Line 21, insert -- low loss -- between "the first and second" and "transformer.".
Lines 24, 34 and 35, insert -- low loss -- between "second" and "transformer.".
Lines 27 and 30, insert -- low loss -- before "first transformer.".
Line 29, change "the first coil" to read -- a first coil --.

Column 6,
Line 19, insert -- further -- before "comprising.".

Signed and Sealed this

Eighteenth Day of April, 2006

JON W. DUDAS
*Director of the United States Patent and Trademark Office*